(12) United States Patent
Watakabe et al.

(10) Patent No.: US 9,947,795 B2
(45) Date of Patent: Apr. 17, 2018

(54) THIN-FILM TRANSISTOR (71) Applicant: Japan Display Inc., Minato-ku (JP)

(72) Inventors: Hajime Watakabe, Tokyo (JP);
Tomoyuki Ariyoshi, Tokyo (JP);
Akihiro Hanada, Tokyo (JP)

(73) Assignee: Japan Display Inc., Minato-ku (JP)

( * ) Notice: Subject to any disclaimer, the term of this patent is extended or adjusted under 35 U.S.C. 154(b) by 0 days.

(21) Appl. No.: 15/388,720

(22) Filed: Dec. 22, 2016

(65) Prior Publication Data

US 2017/0200829 A1    Jul. 13, 2017

(30) Foreign Application Priority Data

Jan. 8, 2016    (JP) .................................. 2016-002595

(51) Int. Cl.
*H01L 29/10*    (2006.01)
*H01L 29/786*    (2006.01)
*H01L 29/24*    (2006.01)
*H01L 27/12*    (2006.01)
*G02F 1/1368*    (2006.01)
*G02F 1/1362*    (2006.01)

(52) U.S. Cl.
CPC .... *H01L 29/78606* (2013.01); *H01L 27/1225* (2013.01); *H01L 29/24* (2013.01); *H01L 29/7869* (2013.01); *G02F 1/1368* (2013.01); *G02F 1/136213* (2013.01); *G02F 2201/121* (2013.01); *G02F 2201/123* (2013.01)

(58) Field of Classification Search
CPC ........... H01L 27/1125; H01L 27/11807; H01L 29/24; H01L 29/7869; H01L 29/78696; H01L 29/26; H01L 51/4233
USPC ..................... 257/43; 438/149–167
See application file for complete search history.

(56) References Cited

U.S. PATENT DOCUMENTS

| 2013/0270549 | A1 | 10/2013 | Okazaki et al. |
| 2013/0299819 | A1* | 11/2013 | Yamazaki ........... H01L 29/7869 257/43 |
| 2014/0042435 | A1* | 2/2014 | Yamazaki ........... H01L 29/7869 257/43 |
| 2014/0151685 | A1* | 6/2014 | Tokunaga ......... H01L 29/78648 257/43 |
| 2016/0247903 | A1 | 8/2016 | Okazaki et al. |

FOREIGN PATENT DOCUMENTS

JP    2014-7381    1/2014

* cited by examiner

*Primary Examiner* — Brook Kebede
(74) *Attorney, Agent, or Firm* — Oblon, McClelland, Maier & Neustadt, L.L.P.

(57) ABSTRACT

According to one embodiment, a thin-film transistor includes a first insulating film, an oxide semiconductor layer provided on the first insulating film and a second insulating film provided on the oxide semiconductor layer, and at least one of the first insulating film and the second insulating film includes a first region in contact with the oxide semiconductor layer and a second region further distant from the oxide semiconductor layer than the first region, and the second region has an argon concentration higher than that of the first region.

19 Claims, 5 Drawing Sheets

THIN-FILM TRANSISTOR

CROSS-REFERENCE TO RELATED APPLICATIONS

This application is based upon and claims the benefit of priority from Japanese Patent Application No. 2016-002595, filed Jan. 8, 2016, the entire contents of which are incorporated herein by reference.

FIELD

Embodiments described herein relate generally to a thin-film transistor.

BACKGROUND

Thin-film transistors which employ semiconductor formed from an oxide in a semiconductor layer have been developed so as to be applied to, for example, display devices including liquid crystal displays and various control circuits, etc. In such thin-film transistors, oxygen is supplied from the oxide film provided in contact with the semiconductor layer to the semiconductor layer, so as to adjust the electrical characteristics including the threshold voltage. However, the rate of forming the oxide film is low, thereby taking such time for the manufacture thereof.

DETAILED DESCRIPTION

In general, according to one embodiment, there is provided a thin-film transistor comprising: a first insulating film; an oxide semiconductor layer provided on the first insulating film; and a second insulating film provided on the oxide semiconductor layer, at least one of the first insulating film and the second insulating film comprising a first region in contact with the oxide semiconductor layer and a second region further distant from the oxide semiconductor layer than the first region, and the second region having an argon concentration higher than that of the first region.

According to another embodiment, there is provided a thin-film transistor comprising: a first insulating film of silicon oxide; a second insulating film of silicon oxide; and an oxide semiconductor layer located between the first insulating film and the second insulating film, the first insulating film comprising a first region and a second region of properties different from each other, the first region being in contact with the oxide semiconductor layer, and the second region being further distant from the oxide semiconductor layer than the first region.

Embodiments will be described hereinafter with reference to the accompanying drawings. Incidentally, the disclosure is merely an example, and proper changes within the spirit of the invention, which are easily conceivable by a skilled person, are included in the scope of the invention as a matter of course. In addition, in some cases, in order to make the description clearer, the widths, thicknesses, shapes, etc. of the respective parts are schematically illustrated in the drawings, compared to the actual modes. However, the schematic illustration is merely an example, and adds no restrictions to the interpretation of the invention. Besides, in the specification and drawings, the structural elements having functions, which are identical or similar to the functions of the structural elements described in connection with preceding drawings, are denoted by like reference numerals, and an overlapping detailed description is omitted unless otherwise necessary.

(First Embodiment)

Figure 1:
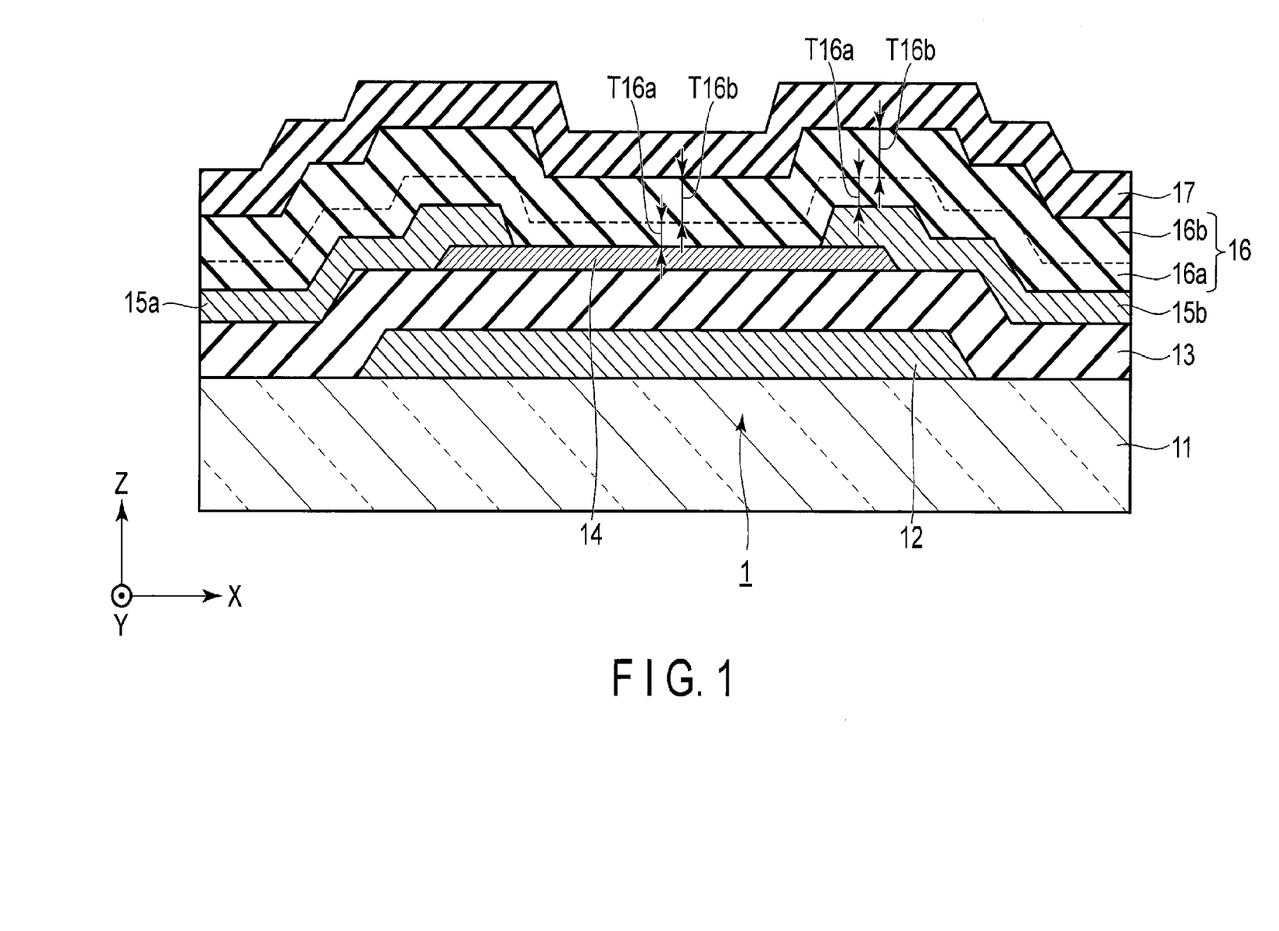
FIG. 1 is a cross section schematically showing an example of a thin-film transistor according to the first embodiment.

FIG. 1 is a cross section view schematically showing a configuration example of a thin-film transistor 1 according to the first embodiment. The thin-film transistor 1 is, for example, a bottom-gate transistor. A first direction X and a second direction Y shown in the figure are parallel to a substrate, and a third direction Z is perpendicular to the substrate. The first direction X and the second direction Y intersect perpendicularly, but they may intersect at an angle other than 90 degrees. In the following descriptions, the third direction Z may be referred to as an upper direction (or merely up) and a direction opposite to the third direction Z may be referred to as a lower direction (or merely down).

An insulating substrate (to be referred to as substrate hereinafter) 11 is formed, for example, from an insulating material such as glass. On a surface of the substrate 11, an insulating film formed of, for example, silicon oxide may be formed as an underlayer.

On the substrate 11, a gate electrode 12 of the thin-film transistor 1 is formed. The gate electrode 12 is formed of, for example, a metal material such as copper, aluminum, titanium, molybdenum or tungsten, or an alloy containing at least one of these.

On the substrate 11, a first insulating film (gate insulating film) 13 is formed to cover the gate electrode 12. The first insulating film 13 is formed from, for example, silicon oxide. The first insulating film 13 may have, for example, a layer structure including a silicon nitride layer interposed between silicon oxide layers.

An oxide semiconductor layer (also referred to as semiconductor layer hereinafter) 14 which functions as an active layer of the thin-film transistor 1 is formed in a region on the first insulating film 13, which corresponds to the gate electrode 12. In other words, the semiconductor layer 14 is formed above the first insulating film 13, directly above the gate electrode 12, that is, in a region overlapping the gate electrode 12.

The semiconductor layer 14 is formed from, for example, an oxide of at least one of indium (In), gallium (Ga), zinc (Zn) and tin (Sn). Typical examples of the material which forms the semiconductor layer 14 are indium-gallium-zinc oxide (IGZO), indium-gallium oxide (IGO), indium-zinc oxide (IZO), zinc-tin oxide (ZnSnO) and zinc oxide (ZnO).

On both ends of the semiconductor layer 14, and the first insulating film 13, source/drain electrodes 15a and 15b are formed. The source electrode 15a and the drain electrode 15b are separated from each other along the first direction X and are respectively in contact with the both ends of the semiconductor layer 14 and also with the first insulating film 13. The source/drain electrodes 15a and 15b are formed from, for example, a metal material such as copper, aluminum, titanium, molybdenum or tungsten, or an alloy containing at least one of these.

On the source/drain electrodes 15a and 15b and the semiconductor layer 14, a second insulating film 16 is formed to cover the source/drain electrodes 15a and 15b and the semiconductor layer 14. The second insulating film 16 is formed from, for example, an oxide insulating material such as silicon oxide. The second insulating film 16 includes a first layer (first region) 16a and a second layer (second region) 16b provided on the first layer 16a. The first layer 16a is an argon-free or low-argon-concentration layer, and is partially in contact with the semiconductor layer 14. The second layer 16b is located further away from the semiconductor layer 14 than from the first layer 16a and is an argon-containing layer having an argon concentration higher than that of the first layer 16a.

More specifically, the argon concentration of the second insulating film 16 is substantially equal to 0 in the region in contact with the semiconductor layer 14 and increases as the location is further away from the semiconductor layer 14.

A thickness T16a of the first layer 16a is less than a thickness T16b of the second layer 16b. For example, the thickness T16a of the first layer 16a is ⅛ to ⅜ of the thickness T16b of the second layer 16b, and it should preferably be ⅙ to ⅓.

Note that the thickness T16a of the first layer 16a and the thickness T16b of the second layer 16b are constant all over the substrate 11. For example, the second insulating film 16 includes a region in contact with the semiconductor layer 14 and regions in contact with the source/drain electrodes 15a and 15b. The thickness T16a of the first layer 16a in the region where the second insulating film 16 is in contact with the semiconductor layer 14 is equal to that in the regions where the second insulating film 16 is in contact with the source/drain electrodes 15a and 15b. Moreover, the thickness T16b of the second layer 16b in the region where the second insulating film 16 is in contact with the semiconductor layer 14 is equal to that in the regions where the second insulating film 16 is in contact with the source/drain electrodes 15a and 15b.

On the second insulating film 16, a third insulating film 17 of, for example, silicon nitride is formed.

Next, the second insulating film 16 will be described in detail.

The second insulating film 16 is formed using, for example, a plasma chemical vapor deposition (CVD), and comprises two layers whose film growth (deposition) rate differ from each other. More specifically, the second insulating film 16 includes a first layer 16a formed at low film growth rate and functioning as an oxygen supply source, and a second layer 16b formed at high film growth rate as compared to that of the first layer 16a having a low capability as an oxygen supply source.

The first layer 16a, functioning as an oxygen supply source, is formed using, for example, silane ($SiH_4$) gas and nitrogen monoxide ($N_2O$) gas. Therefore, the film growth rate is low.

On the other hand, the second layer 16b, which does not need to function as an oxygen supply source is formed by adding argon to $SiH_4$ and $N_2O$ gas. With the addition of argon, the film growth rate of the insulating film can be made higher as compared to the case where argon is not added.

Further, with argon ion, the growth surface of the insulating film is subjected to ion impact, and thus as compared to the case where argon is not added, the film density of the insulating film thus formed is higher. That is, the film density of the second layer 16b is higher than that of the first layer 16a.

Furthermore, since argon functions as a diluent gas in the processing chamber of the plasma-CVD device, the decomposition efficiency by plasma is improved. Thus, the decomposition of nitrogen introduced to the processing chamber is promoted. As a result, the nitrogen concentration of the second layer 16b is lower than that of the first layer 16a.

The configuration of the second insulating film 16, which comprises the first layer 16a and the second layer 16b which differ from each other in property, can be detected by various analyses.

For example, with a secondary ion mass spectrometry (SIMS), the change in the concentration of at least one of argon and nitrogen along the third direction (film stacking direction) Z in the second insulating film 16 can be detected. Thus, it is possible to detect that the second insulating film 16 comprises two layers of different properties.

For example, it is detected that the argon concentration of the second layer 16b is higher than that of the first layer 16a. Thus, it can be known that the second insulating film 16 includes two regions of different argon concentrations. For example, it is detected that the nitrogen concentration of the first layer 16a is higher than that of the second layer 16b. Thus, it can be known that the second insulating film 16 includes two regions of different nitrogen concentrations.

For example, with use of the SIMS, it is possible to identify the boundary between the first layer 16a and the second layer 16b by detecting the fluoride segregated on the boundary between the first layer 16a and the second layer 16b.

For example, with use of the Rutherford back scattering spectroscopy (RBS), the change in the concentration of at least one of argon and nitrogen along the third direction Z can be detected. Based on this result, it is judged that the second insulating film 16 includes two layers of different properties.

For example, with use of the RBS, the change in the film density along the third direction Z can be detected, and thus it is judged that the second insulating film 16 includes two layers of different properties.

In addition, when a thermal desorption gas spectroscopy (TDS) is used, it is judged, if argon gas is detected, that at least one insulating film which is formed using argon is included. Thus, it can be judged that the second insulating film 16 includes at least one second layer 16b.

Next, with reference to FIGS. 2, (a) to 2(d), a method of manufacturing the thin-film transistor 1 shown in FIG. 1 will be described.

Figure 2:
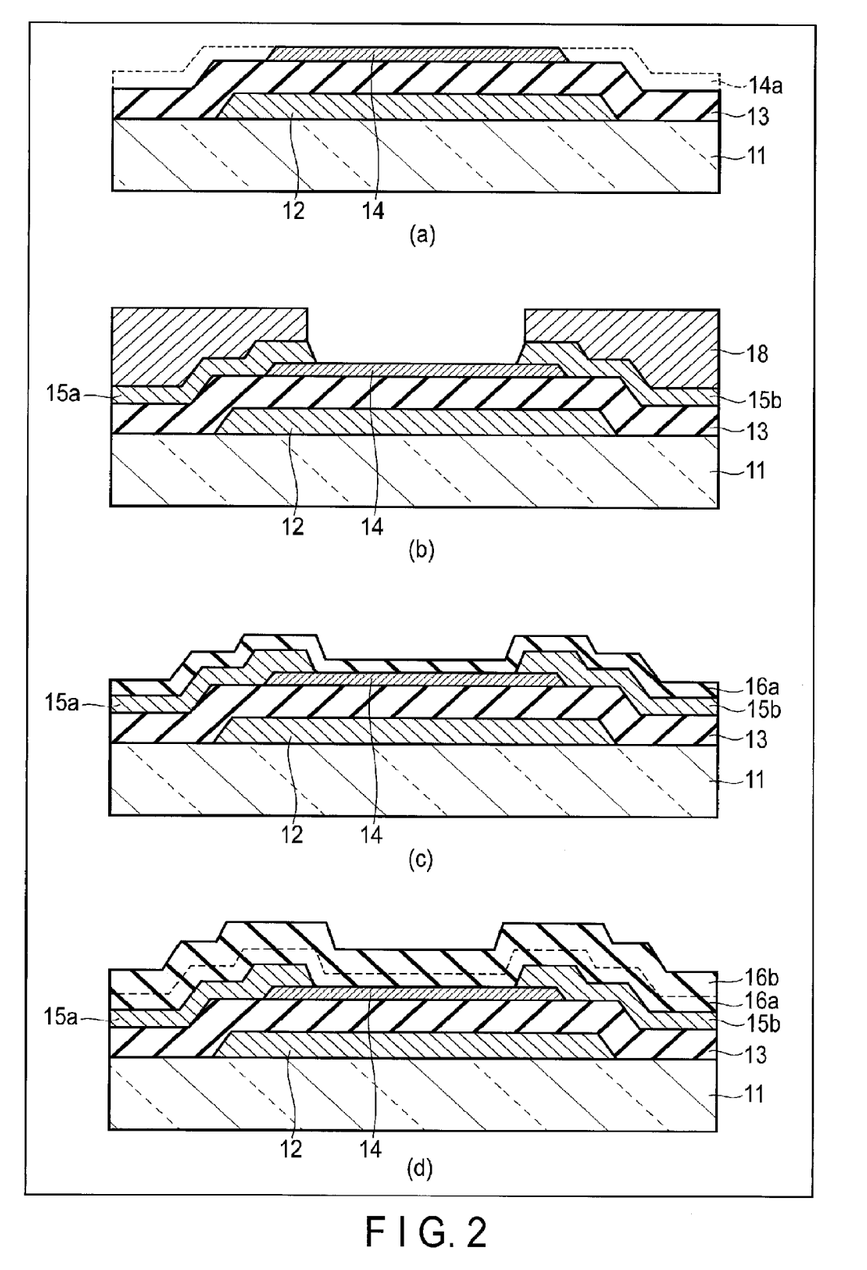
FIG. 2 is a cross section schematically showing a method of manufacturing of the thin-film transistor shown in FIG. 1.

As shown in FIG. 2, (a), the first insulating film 13 of, for example, silicon oxide is formed on the substrate 11 on which the gate electrode 12 is formed, using, for example, the plasma CVD method. During this period, argon is introduced to the processing chamber of the plasma-CVD device. Thus, the film growth rate of the first insulating film 13 is improved as compared to the case where argon is not introduced. Subsequently, the oxide semiconductor layer 14a of, for example, an oxide of at least one of indium (In), gallium (Ga), zinc (Zn) and tin (Sn) is formed on the first insulating film 13 using, for example, the sputtering method. Then, the oxide semiconductor layer 14a is etched to form, for example, island-like oxide semiconductor layer 14.

Next, as shown in FIG. 2, (b), a metal layer of any one of copper, aluminum, titanium, molybdenum and tungsten, or an alloy containing at least one of these, or the like is formed on the resultant using, for example, the sputtering method.

Subsequently, a resist layer 18 including an opening is formed on the metal layer. The metal layer is etched using the resist layer 18 as a mask, and thus the source/drain electrodes 15a and 15b are formed. Next, as shown in FIG. 2, (c), after removing the resist layer 18, the first layer 16a of, for example, silicon oxide is formed on the oxide semiconductor layer 14 and the source/drain electrodes 15a and 15b using, for example, the plasma CVD method. More specifically, $SiH_4$ and $N_2O$ gases are introduced to the processing chamber of the plasma-CVD device while forming the first layer 16a. Here, argon is not introduced to the processing chamber of the plasma-CVD device. The thus formed first layer 16a functions as an oxygen supply source which supplies oxygen to the semiconductor layer 14.

Next, as shown in FIG. 2, (d), the second layer 16b of, for example, silicon oxide is formed on the first layer 16a using, for example, the plasma CVD method. That is, the second layer 16b is formed continuously to the formation of the first layer 16a. Here, argon is introduced into the processing chamber of the plasma-CVD device. Thus, the film growth rate of the second layer 16b is higher as compared to the case where argon is not introduced.

Next, the semiconductor layer 14 is subjected to heat treatment. Thus, the oxygen contained in the first layer 16a is diffused to the region of the semiconductor layers 14, which is in contact with the first layer 16a. As a result, the oxygen-vacancy defects in the semiconductor layer 14 are supplemented.

Note that the heat treatment in the process shown in FIG. 2, (d) can be omitted. That is, if sufficient oxygen for the semiconductor layer 14 can be supplied from the first layer 16a by the heat generated in a processing step after that shown in FIG. 2, (d), the heat treatment can be omitted.

Next, as shown in FIG. 1, silicon nitride is deposited all over the substrate 11 using, for example, CVD, to form the third insulating film 17 as a protective film, and thus, the thin-film transistor 1 is formed.

Note that the bottom-gate thin-film transistor is described only as an example in this embodiment, this embodiment is applicable also to a top-gate thin-film transistor.

According to this embodiment, the second insulating film 16 provided on the oxide semiconductor layer 14 includes the first layer 16a as an oxygen supply source and the second layer 16b having a low capability as an oxygen supply source, and when forming the second layer 16b, argon is added to the source gas. Therefore, the film growth rate of the second layer 16b, which is thicker than the first layer 16a, can be made increased, and the total time for forming the second insulating film 16 can be shortened as compared to the case where argon is not added. In this manner, it is possible to remarkably shorten the production time for the thin-film transistor 1.

Further, by adjusting the ratio in thickness between the first layer 16a and the second layer 16b, the amount of oxygen supplied to the semiconductor layer 14 can be adjusted. For example, if the thickness of the first layer 16a in the second insulating film 16 is increased, the amount of oxygen supplied to the semiconductor layer 14 is increased. For example, if the thickness of the first layer 16a in the second insulating film 16 is decreased, the amount of oxygen supplied to the semiconductor layer 14 is decreased. Therefore, by adjusting the ratio in thickness between the first layer 16a and the second layer 16b, the threshold voltage of the thin-film transistor 1 can be controlled.

Furthermore, since the second layer 16b has a low capacity as an oxygen supply source, it is possible to suppress excessive supply of oxygen to the semiconductor layer 14 as compared to the case where the second insulating film 16 comprises only the first layer 16a. Therefore, the generation of oxygen radicals can be suppressed. As a result, creation of the defect level, which may be caused by oxygen radicals in the semiconductor layer 14, can be suppressed, thereby making it possible to obtain stable electrical characteristics.

(Second Embodiment)

In the first embodiment described above, the first layer 16a, which has a low film growth rate and functions as an oxygen supply source, is formed on the semiconductor layer 14 and the source/drain electrodes 15a and 15b, and the second layer 16b, which has a high film growth rate and a low capability as an oxygen supply source, is formed on top of it.

On the other hand, in the second embodiment, oxygen is supplied to a semiconductor layer from a gate insulating film provided between a gate electrode and a semiconductor layer.

Figure 3:
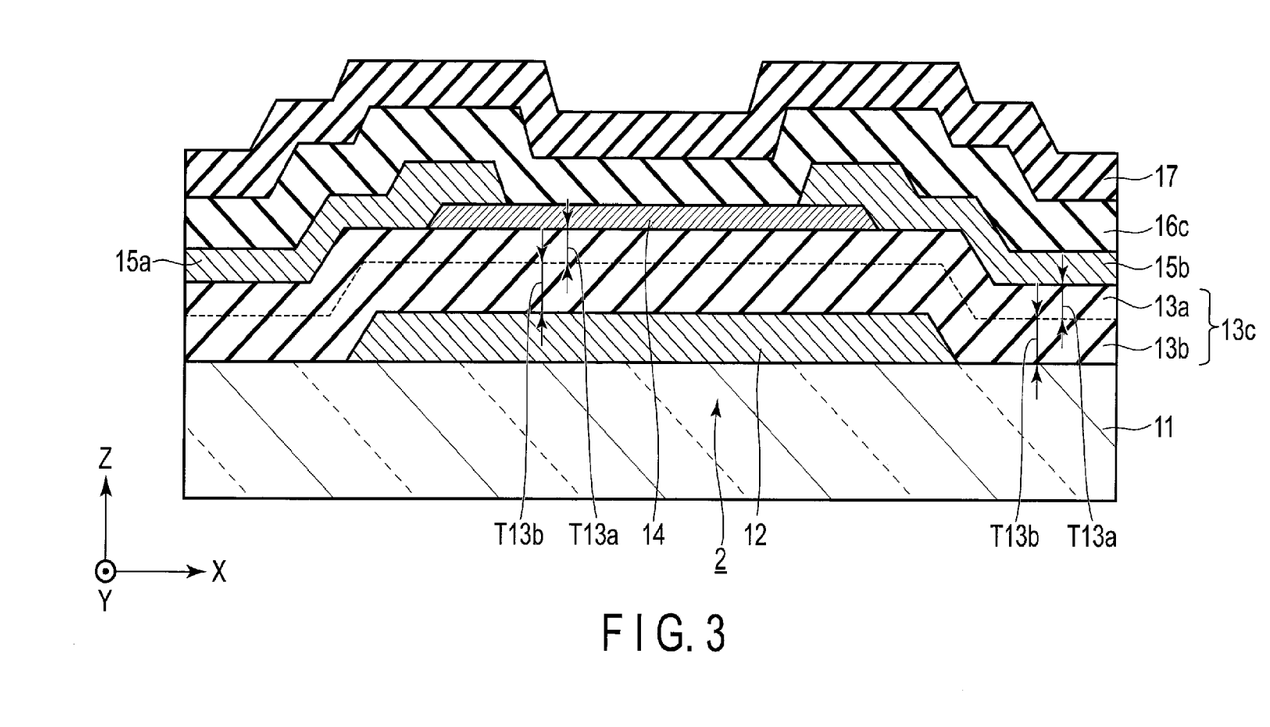
FIG. 3 is a diagram schematically showing an example of a thin-film transistor according to the second embodiment.

FIG. 3 is a cross section schematically showing an example of a thin-film transistor 2 according to the second embodiment.

On a substrate 11, a first insulating film (gate insulating film) 13c is formed to cover a gate electrode 12. The first insulating film 13c is formed from, for example, an oxide insulating material such as silicon oxide. The first insulating film 13c includes a second layer (second region) 13b formed on the substrate 11 and the gate electrode 12 and having low capability as an oxygen supply source, and a first layer (first region) 13a formed on the second layer 13b and functioning as an oxygen supply source. A thickness T13a of the first layer 13a is less than a thickness T13b of the second layer 13b. For example, the thickness T13a of the first layer 13a is ⅛ to ⅜ of the thickness T13b of the second layer 13b, or preferably, ⅙ to ⅓ thereof.

Note that as in the first embodiment, the thickness T13a of the first layer 13a and the thickness T13b of the second layer 13b are constant all over the substrate 11. For example, the first insulating film 13c includes a region in contact with the gate electrode 12 and a region in contact with the substrate 11. The thickness T13a of the first layer 13a in the region where the first insulating film 13c is in contact with the gate electrode 12 is equal to that in the region where the first insulating film 13c is in contact with the substrate 11. Moreover, the thickness T13b of the second layer 13b in the region where the first insulating film 13c is in contact with the gate electrode 12 is equal to that in the region where the first insulating film 13c is in contact with the substrate 11. Note that in a few cases, depending on the oxide semiconductor processing method, a portion of the first layer 13a, which is not covered by the semiconductor layer 14, may be etched to be thinner during the step of processing the oxide semiconductor layer (overetching).

The first layer 13a and the second layer 13b are of oxide films of the same properties as those of the first layer 16a and the second layer 16b in the first embodiment, respectively. That is, the film growth rate of the first layer 13a is lower than that of the second layer 13b. The nitrogen concentration of the first layer 13a is higher than that of the second layer 13b. The argon concentration of the second layer 13b is higher than that of the first layer 13a. The film density of the second layer 13b is larger than that of the first layer 13a.

An oxide semiconductor layer 14 is formed on the first layer 13a. In other words, an entire surface of the semiconductor layer 14, which is on the side of the substrate 11 is in contact with the first layer 13a.

On source/drain electrodes 15a and 15b and the semiconductor layer 14, a second insulating film 16c is formed to cover these. The second insulating film 16c is an oxide film of the same properties as those of the second layer 16b in the first embodiment.

Since the other structure is the same as that of the first embodiment, the explanation therefor will be omitted.

The manufacturing method of the second embodiment is substantially the same as that of the first embodiment except for the first insulating film 13c. The first insulating film 13c is formed by, for example, CVD using $SiH_4$ and $N_2O$ as source gases. More specifically, first, $SiH_4$ and $N_2O$ gases and argon gas are introduced to the processing chamber to form the second layer 13b. Then, the introduction of argon gas is stopped and the first layer 13a is formed. Thus, the first insulating film 13c including the first layer 13a and the second layer 13b is formed.

According to the second embodiment, an advantageous effect similar to that of the first embodiment can be obtained.

(Third Embodiment)

In the first and second embodiments, oxygen is supplied to the semiconductor layer 14 from one of the insulating films in contact therewith.

On the other hand, in the third embodiment, oxygen is supplied to a semiconductor layer 14 from two insulating films in contact therewith.

Figure 4:
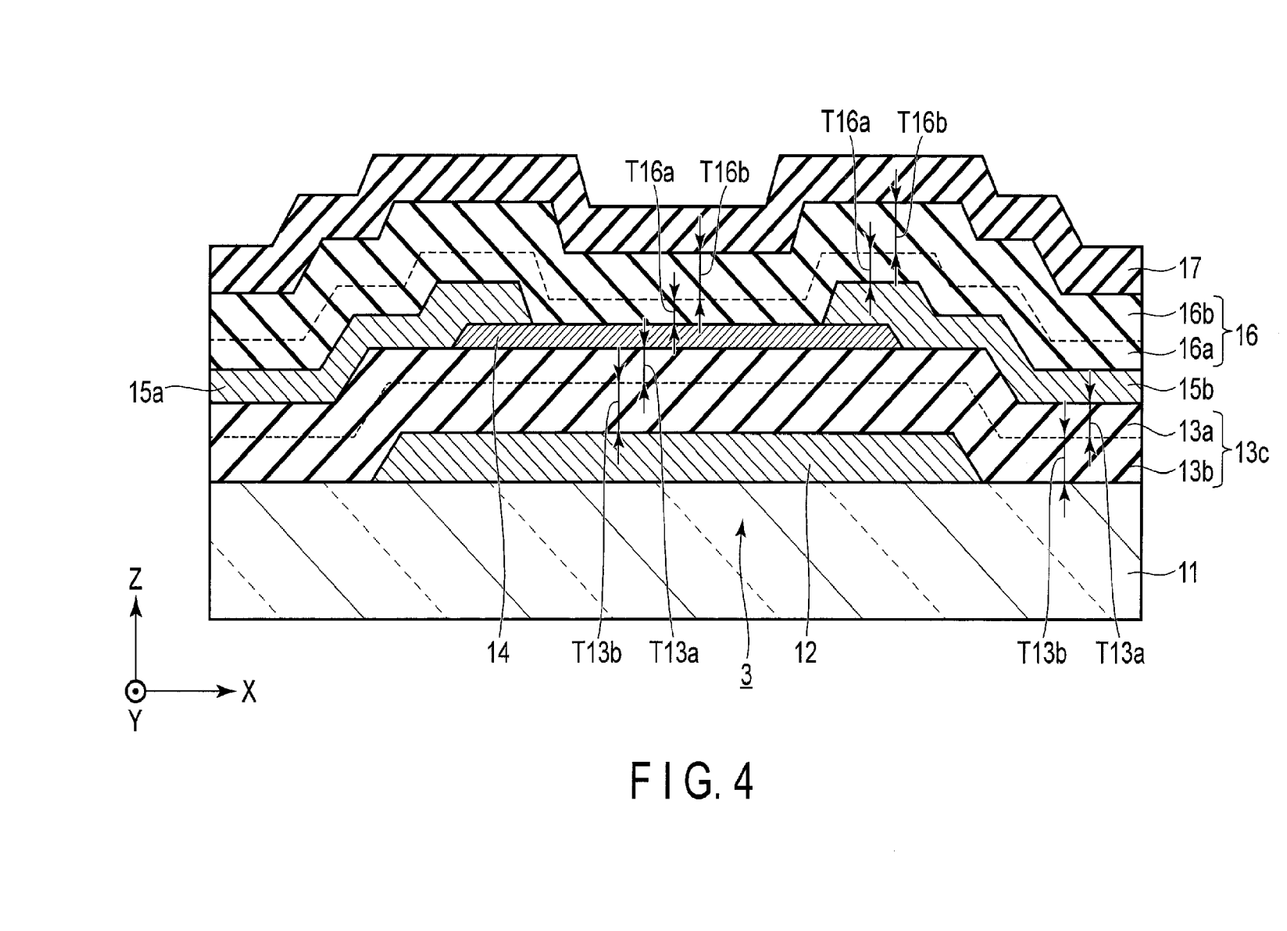
FIG. 4 is a diagram schematically showing an example of a thin-film transistor according to the third embodiment.

FIG. 4 is a cross section schematically showing an example of a thin-film transistor 3 according to the third embodiment.

On a substrate 11 on which a gate electrode 12 is formed, a first insulating film 13c including a first layer (first region) 13a having a low film growth rate and functioning as a oxygen supply source and a second layer (second region) 13b having a high film growth rate and a low capability as an oxygen supply source is formed as in the second embodiment. In other words, the second layer 13b is formed on the gate electrode 12 and the substrate 11. The first layer 13a is formed on the second layer 13b so as to be in contact with the semiconductor layer 14.

On the semiconductor layer 14, a second insulating film 16 including a first layer (third region) 16a having a low film growth rate and functioning as an oxygen supply source and a second layer (fourth region) 16b having a high film growth rate and a low capability as an oxygen supply source is formed as in the first embodiment. In other words, the first layer 16a is formed on the semiconductor layer 14 and the source/drain electrodes 15a and 15b.

Since the other structure is the same as those of the first and second embodiments, the explanation therefor will be omitted.

According to the third embodiment described above, the semiconductor layer 14 is interposed between the first layer 13a of the first insulating film 13c, which functions as an oxygen supply source, and the first layer 16a of the second insulating film 16, which also functions as an oxygen supply source. With this structure, thereby, oxygen is supplied to the semiconductor layer 14 from both the first insulating film 13 and the second insulating film 16. Therefore, it is possible to supply oxygen to the semiconductor layer 14 efficiently and evenly as compared to the first or second embodiments.

Example of Application

A display device can be manufactured using the thin-film transistor described in any of the first to third embodiments.

Figure 5:
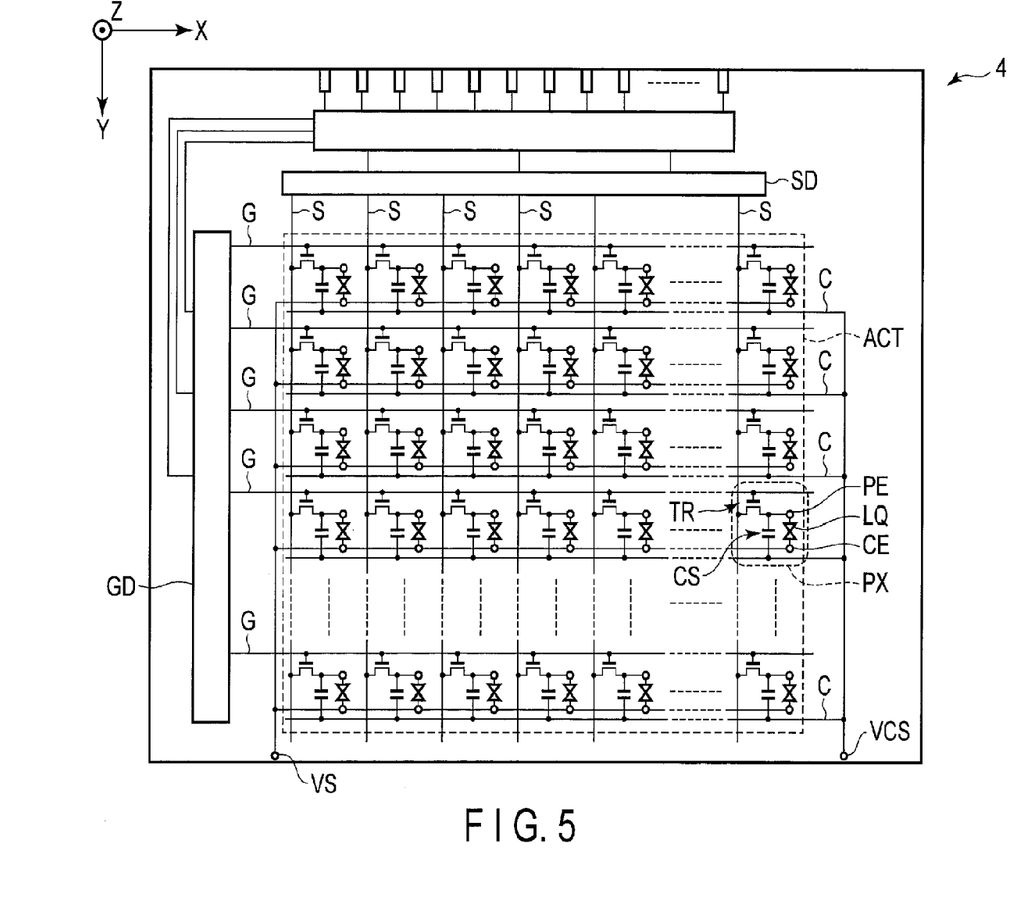
FIG. 5 is a circuit diagram showing an example of a display device to which the thin-film transistor according to any of these embodiments is applied.

FIG. 5 schematically shows a configuration example of a display device 4 comprising any of thin-film transistors 1 to 3 described in the first to third embodiments. In this example, the display device 4 is, for example, a liquid crystal display comprising liquid crystal elements. Not only to liquid crystal displays, the thin-film transistor TR described in any of the first to third embodiments can be applied all types of flat-panel display devices, such as organic electroluminescence (EL) display devices, other self-emission display devices, or electronic-paper display devices including an electrophoretic element and the like.

As shown in FIG. 5, the display device 4 comprises an active area (display area) ACT which displays images and a peripheral circuit area (non-displaying area) on an outer side of the active area ACT. The active area ACT includes a plurality of pixel PXs arranged along, for example, in a first direction (row direction) X, and a second direction (column direction) Y. The display device 4 comprises a plurality of gate lines G extending in the first direction X, a plurality of capacity lines C extending parallel to the plurality of gate lines G, and a plurality of source lines S extending in the second direction Y which intersects the gate lines G and the capacity lines C.

The peripheral circuit area comprises a gate driver GD, a source driver SD, a voltage applying module VCS, a power supply module VS and the like. Each gate line G extends out to an outside of the active area ACT so as to be connected to the gate driver GD. Each source line S extends out to an outside of the active area ACT so as to be connected to the source driver SD. Each capacity line C extends out to an outside of the active area ACT so as to be connected to the voltage applying module applying module VCS.

Each pixel PX comprises a thin-film transistor TR, a capacitor CS, a pixel electrode PE, a common electrode CE and a liquid crystal layer LQ provided between the pixel electrode PE and the common electrode CE. The thin-film transistor TR is a transistor having the structure described in the first, second or third embodiment. A gate electrode of the thin-film transistor TR is connected to the respective gate line G. A first electrode (source electrode 15a) of the thin-film transistor TR is connected to the respective source line S, and a second electrode (drain electrode 15b) of the thin-film transistor TR is connected to a first electrode of the capacitor CS and the pixel electrode PE. A second electrode of the capacitor CS is connected to the respective capacity line C. The common electrode CE is connected to the power supply module VS provided outside the active area ACT.

Note that the thin-film transistor described in the first, second or third embodiment may be used for circuits which constitutes the gate driver GD, source driver SD or the like, of the display device 4.

According to the display device 4 comprising such a thin-film transistor TR, a light-caused leakage current can be reduced and the installation area of the thin-film transistor can be reduced as compared to a display device employing a silicon-semiconductor thin-film transistor. Therefore, the power consumption can be reduced, and further the opening area which contributes to displaying in each pixel can be expanded.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A thin-film transistor comprising:
   a first insulating film;

an oxide semiconductor layer provided on the first insulating film; and a second insulating film provided on the oxide semiconductor layer;

at least one of the first insulating film and the second insulating film containing argon and comprising a first region in contact with the oxide semiconductor layer and a second region further distant from the oxide semiconductor layer than the first region, and the second region having an argon concentration higher than that of the first region.

2. The thin-film transistor of claim 1, wherein
in at least one of the first insulating film and the second insulating film, a thickness of the first region is less than that of the second region.

3. The thin-film transistor of claim 2, wherein
the thickness of the first region is ⅙ to ⅓ of that of the second region.

4. The thin-film transistor of claim 1, wherein
at least one of the first insulating film and the second insulating film comprises the first region and the second region and contains nitrogen, and
a concentration of nitrogen contained in the first region is higher than that in the second region.

5. The thin-film transistor of claim 1, wherein
a film density of the first region is less than that of the second region.

6. The thin-film transistor of claim 1, wherein
a boundary between the first region and the second region contains fluoride.

7. The thin-film transistor of claim 1, wherein
the oxide semiconductor layer is formed of an oxide containing at least one of indium, gallium, zinc and tin.

8. The thin-film transistor of claim 1, wherein
the first region and the second region are formed of silicon oxide.

9. The thin-film transistor of claim 1, wherein
the first insulating film and the second insulating film are formed of silicon oxide and are in contact with the oxide semiconductor layer.

10. The thin-film transistor of claim 1, further comprising:
a substrate;
a gate electrode located between the substrate and the first insulating film; and
a pair of electrodes in contact with the oxide semiconductor layer between the oxide semiconductor layer and the second insulating film, and separated from each other along a first direction.

11. A thin-film transistor comprising:
a first insulating film of silicon oxide;
a second insulating of silicon oxide; and
an oxide semiconductor layer located between the first insulating film and the second insulating film,
the first insulating film containing argon and comprising a first region and a second region of properties different from each other,
the first region being in contact with the oxide semiconductor layer,
the second region being further distant from the oxide semiconductor layer than the first region, and
a concentration of argon contained in the second region being higher than that in the first region.

12. The thin-film transistor of claim 11, wherein
the second insulating film comprises a third region and a fourth region of properties different from each other,
the third region is in contact with the oxide semiconductor layer, and
the fourth region is further distant from the oxide semiconductor layer than the third region.

13. The thin-film transistor of claim 12, further comprising:
a substrate;
a gate electrode located between the substrate and the first insulating film; and
a pair of electrodes in contact with the oxide semiconductor layer between the oxide semiconductor layer and the second insulating film, and separated from each other along a first direction.

14. The thin-film transistor of claim 13, wherein
the first insulating film is in contact with the substrate and the gate electrode,
a thickness of the first region in a region where the first insulating film is in contact with the substrate is equal to that in a region where the first insulating film is in contact with the gate electrode, and
a thickness of the second region in a region where the first insulating film is in contact with the substrate is equal to that in a region where the first insulating film is in contact with the gate electrode.

15. The thin-film transistor of claim 13, wherein
the second insulating film is in contact with the pair of electrodes,
a thickness of the third region in regions where the second insulating film is in contact with the pair of electrodes is equal to that in a region where the second insulating film is in contact with the oxide semiconductor layer, and
a thickness of the fourth region in regions where the second insulating film is in contact with the pair of electrodes is equal to that in a region where the second insulating film is in contact with the oxide semiconductor layer.

16. The thin-film transistor of claim 11, wherein
the first insulating film contains nitrogen, and
a concentration of nitrogen contained in the first region is higher than that in the second region.

17. The thin-film transistor of claim 11, wherein
a film density of the first region is less than that of the second region.

18. The thin-film transistor of claim 11, wherein
at least one of the first insulating film and the second insulating film contains segregated fluoride.

19. The thin-film transistor of claim 11, wherein
the second insulating film is covered by a silicon nitride film.

* * * * *